(12) United States Patent
Kasperkovitz (10) Patent No.: US 10,063,193 B2
(45) Date of Patent: Aug. 28, 2018

(54) CLASS D AMPLIFIER

(71) Applicant: Semiconductor Ideas to the Market (ITOM) B.V., Eindhoven (NL)

(72) Inventor: Wolfdietrich Georg Kasperkovitz, Waalre (NL)

(73) Assignee: Semiconductor Ideas to the Market (ITOM) B.V., Eindhoven (NL)

( * ) Notice: Subject to any disclaimer, the term of this patent is extended or adjusted under 35 U.S.C. 154(b) by 8 days.

(21) Appl. No.: 15/483,067

(22) Filed: Apr. 10, 2017

(65) Prior Publication Data

US 2017/0302232 A1  Oct. 19, 2017

(30) Foreign Application Priority Data

Apr. 13, 2016 (EP) .................................... 16165171

(51) Int. Cl.
*H03F 3/217* (2006.01)
*H03F 1/32* (2006.01)
(Continued)

(52) U.S. Cl.
CPC ......... *H03F 1/3205* (2013.01); *H03F 1/3217* (2013.01); *H03F 3/185* (2013.01); *H03F 3/2171* (2013.01); *H03F 3/3022* (2013.01); *H03F 3/217* (2013.01); *H03F 3/2173* (2013.01); *H03F 2200/03* (2013.01); *H03F 2200/297* (2013.01); *H03F 2200/301* (2013.01); *H03F 2200/303* (2013.01); *H03F 2200/312* (2013.01); *H03F 2200/351* (2013.01); *H03F 2200/391* (2013.01); *H03F 2200/417* (2013.01);
(Continued)

(58) Field of Classification Search
CPC ... H03F 1/04; H03F 1/34; H03F 3/217; H03F 3/2171; H03F 3/2173; H03F 2200/351; H03F 2200/432; H03F 2200/78
USPC .............................................. 330/207 A, 251
See application file for complete search history.

(56) References Cited

U.S. PATENT DOCUMENTS 6,294,954 B1 * 9/2001 Melanson ................. H03F 1/32
326/83
7,151,406 B2  12/2006 Labbe
(Continued)

FOREIGN PATENT DOCUMENTS

GB  2424237  9/2006

*Primary Examiner* — Khanh V Nguyen
(74) *Attorney, Agent, or Firm* — Robert M. McDermott (57) ABSTRACT

A class D amplifier output stage including an input for receiving an input signal, an output for providing an output signal to a load, serially coupled upper and lower switching devices configured to provide an output signal to the output, a driver circuit configured to receive the input signal, and to derive therefrom first and second drive signals for driving the upper and lower switching devices alternately from a conducting state into a non-conducting state and vice versa, such that the conducting state periods of the upper switching device with respect to those of the lower switching device are mutually exclusive and separated by dead time intervals during which both upper and lower output transistors are non-conducting. To reduce distortion and more particularly, total harmonic distortion (THD), the amplifier output stage includes a substantially linear circuit configured to provide a bidirectional current sink for residual currents from the load occurring during at least part of each dead time interval.

20 Claims, 10 Drawing Sheets (51) Int. Cl.
*H03F 3/185* (2006.01)
*H03F 3/30* (2006.01)

(52) U.S. Cl.
CPC .. *H03F 2200/421* (2013.01); *H03F 2200/426* (2013.01); *H03F 2200/432* (2013.01); *H03F 2200/441* (2013.01); *H03F 2200/444* (2013.01); *H03F 2200/459* (2013.01)

(56) References Cited

U.S. PATENT DOCUMENTS

| | | | |
|---|---|---|---|
| 8,139,792 B2* | 3/2012 | Magrath | H03F 1/305 |
| | | | 330/10 |
| 8,760,229 B2* | 6/2014 | Lee | H03F 3/217 |
| | | | 330/207 A |
| 2006/0233234 A1 | 10/2006 | Lim | |
| 2009/0115519 A1 | 5/2009 | Ishiguro | |
| 2010/0244958 A1* | 9/2010 | Tsuji | H03F 3/2173 |
| | | | 330/251 |

* cited by examiner

CLASS D AMPLIFIER

This application claims the benefit of EP16165171, filed 13 Apr. 2016.

BACKGROUND AND SUMMARY OF THE INVENTION

The invention is in the field of class D amplifiers and provides circuits and techniques that reduce distortion and power loss in the output stage thereof.

A prior art class D amplifier output stage typically includes an input for receiving an input signal, an output for providing an output signal to a load, serially coupled upper and lower switching devices configured to provide an output signal to the output, a driver circuit configured to receive the input signal, and to derive therefrom first and second drive signals for driving the upper and lower switching devices alternately from a conducting state into a non-conducting state and vice versa, such that the conducting state periods of the upper switching device with respect to those of the lower switching device are mutually exclusive and separated by dead times during which both upper and lower switching devices are non-conducting.

Dead times, also being referred to as dead time intervals, result from turn on delays, intentionally added to the drive signals of the switching devices to secure the switching device that is turning off to turn off before the other switching device turns on, so as to prevent both switching devices from conducting simultaneously. In response to the output current interruptions during dead times, reactive currents, also being referred to as residual load currents, flow back or forth from the load into the output stage. Conventionally, these residual load currents are shunted to the terminals of a supply voltage through diodes connected parallel to the switching devices.

Figure 9:
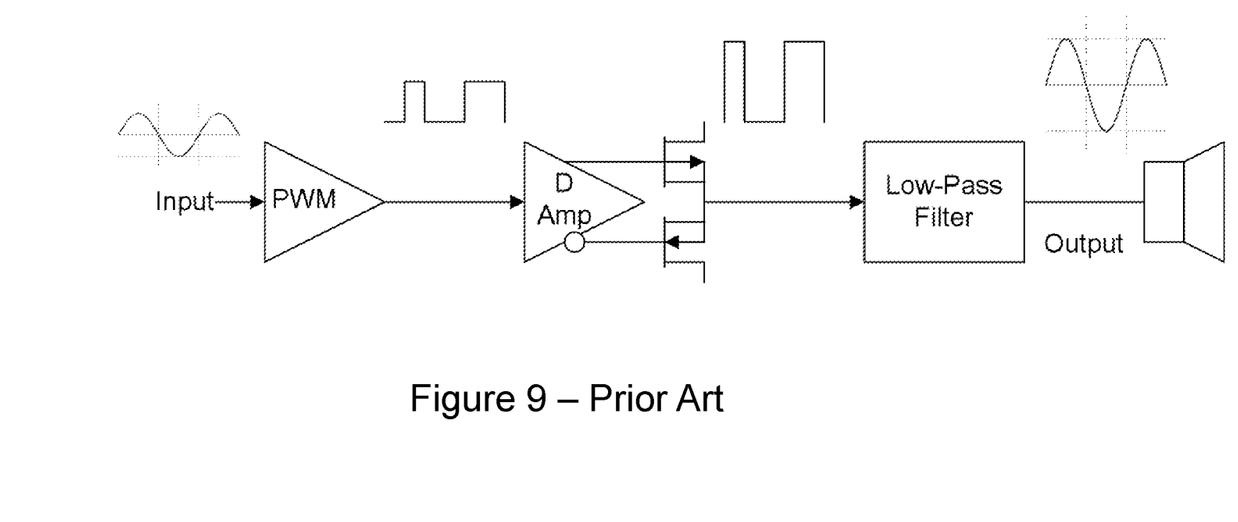
FIG. 9 is an example Class-D amplifier in a conventional audio amplifier application.

Class D amplifiers are commonly used in audio amplifier applications, such as illustrated in FIG. 9. A class D amplifier is commonly termed a switching amplifier, because the amplifying devices perform as switches, rather than as linear gain devices. The signal to be amplified is a train of constant amplitude pulses, such as a pulse-width modulated signal, and the active devices switch back and forth between fully conductive and fully nonconductive states. After amplification, the pulse train may be converted back to an analog signal by passing the pulse train through a low-pass filter. This analog signal may then drive a speaker to produce the amplified audio output. Optionally, the speaker may be part of the low-pass filter.

The theoretical power efficiency of a class D amplifier is 100%, because in the conduction state, there is no voltage loss across the switching device, and in the non-conduction state, there is no current flowing; accordingly, there is ideally no heat generated. Real-world class D amplifiers typically operate at over 90% efficiency, compared to class AB amplifiers that typically operate at below 80% efficiency. However, due to transient switching effects, class D amplifiers are generally more susceptible to harmonic distortion than class AB amplifiers.

Dead time is a major contributing factor to harmonic distortion in class D amplifiers. Many attempts have been made to minimize harmonic distortion, in particular total harmonic distortion (THD) caused by dead times using various different principles. For instance, U.S. Pat. No. 7,151,406 shows the use of a current sensing circuit configured to determine the direction of a current flowing through the load during at least two dead time intervals. An output signal of this current sensing circuit is fed back to a driver circuit to increase or decrease the duty cycles of first and second drive signals driving upper and lower switching transistors based on the residual load current flowing through the transistors, such that the duty cycle of the amplifier output remains substantially constant and equal to the duty cycle of the amplifier input.

However, due to the complexity of the underlying compensation principle and the use of a feedback control mechanism therein, this known class D amplifier output stage is highly demanding with regard to the accuracy and performance of the circuitry needed.

In consequence, amongst other things, it is an object of the present invention to significantly improve the performance of conventional class D amplifiers, in particular THD, power loss, robustness and/or design simplicity.

It is another object of the invention to enable the optimization of performance on power saving and THD separately, or in a mutual trade off, dependent on the amplifier's field of use.

Now, therefore, an example embodiment of a class D amplifier output stage implementing the method according to the invention includes an input for receiving an input signal, an output for providing an output signal to a load, serially coupled upper and lower switching devices configured to provide an output signal to the output, a driver circuit configured to receive the input signal, and to derive therefrom first and second drive signals for driving the upper and lower switching devices alternately from a conducting state into a non-conducting state and vice versa, such that the conducting state periods of the upper switching device with respect to those of the lower switching device are mutually exclusive and separated by dead time intervals during which both upper and lower output transistors are non-conducting, and is characterized by a substantially linear circuit configured to provide a bidirectional current sink for residual load currents occurring during at least part of each dead time interval.

An example embodiment of a method of operating a class D amplifier output stage according to the invention comprises the steps of: converting an input signal to first and second drive signals for driving the upper and lower switching devices alternately from a conducting state into a non-conducting state and vice versa, such that the conducting state periods of the upper switching device with respect to those of the lower switching device are mutually exclusive and separated by dead times during which both upper and lower output transistors are non-conducting, and is characterized by the step of substantially linearizing signal transients caused by residual load currents from the load occurring during at least part of each dead time.

The invention is based on the insight that although residual load currents are limited to the duration of dead times, non-linearities in signal transients caused by these residual load currents often predominate the overall THD performance of a class D output stage.

By using a substantially linear circuit for sinking the residual load currents in accordance to the invention, non-linear signal transients during dead times are avoided or at least significantly minimized. Furthermore, such substantially linear circuit allows for a cost effective and robust implementation and provides in its degree of linearity a possibility to make various trade-offs, e.g. between THD and power saving performance or between circuit complexity and power saving performance without compromising on THD, as will be shown hereinafter.

The improvement of the overall THD performance of the output stage relative to that of the first mentioned prior art output stage increases with the linearity of the circuit. An effective THD improvement has been obtained with the circuit linearizing signals within an amplitude range of at least 30% of the maximum signal output range.

In an embodiment of the invention, in which the circuit may be fully linear, the circuit includes a resistor configured to provide the bidirectional current sink for residual load currents, hereafter also referred to as a sink resistor. This measure substantially prevents any non-linearities in the output signal transients during dead time from occurring.

In another embodiment, a pair of serially coupled common drain CMOS switching transistors is used to implement the upper and lower switching devices to provide linear switching.

In an embodiment for which power consumption is not a critical factor, the resistance value of the sink resistor is chosen to be at most equal to that of load resistor Rl. This measure reduces non-linearities in the transients of the output signal during dead times to a minimum, providing a linear mode operation.

In an embodiment that allows for a compromise between power consumption and THD performance, the resistance value of the sink resistor is chosen to exceed that of load resistor Rl. In this embodiment, non-linearities in the transients of the output signal during dead times are reduced, whereas the output signal Vout is not limited to the voltage range between Vs and ground, providing an extended linear mode operation.

In another embodiment, diodes are coupled in parallel to the serially coupled common drain CMOS switching transistors, whereas the resistance value of sink resistor Rs is chosen to exceed that of load resistor Rl. In this embodiment, the output signal during dead times is limited by the diodes, providing a mixed mode operation.

An embodiment enabling the optimization of performance on power saving and THD separately includes a switching device configured to limit operation of the sink resistor Rs as linear bidirectional current sink to the duration of dead times only. A switched linear operation mode is therewith obtained that optimizes performance on power saving without compromising on THD performance.

In another preferred embodiment, performance on power saving is obtained by a serial coupling of the sink resistor and a buffer capacitor between the output of the amplifier output stage and ground, configured to supply power to the output stage during dead times and to buffer power beyond the dead times.

These and further aspects and advantages of the invention will be discussed more in detail hereinafter with reference to the disclosure of preferred embodiments, and in particular with reference to the appended Figures in which like reference numerals refer to like elements, and wherein.

Figure 1:
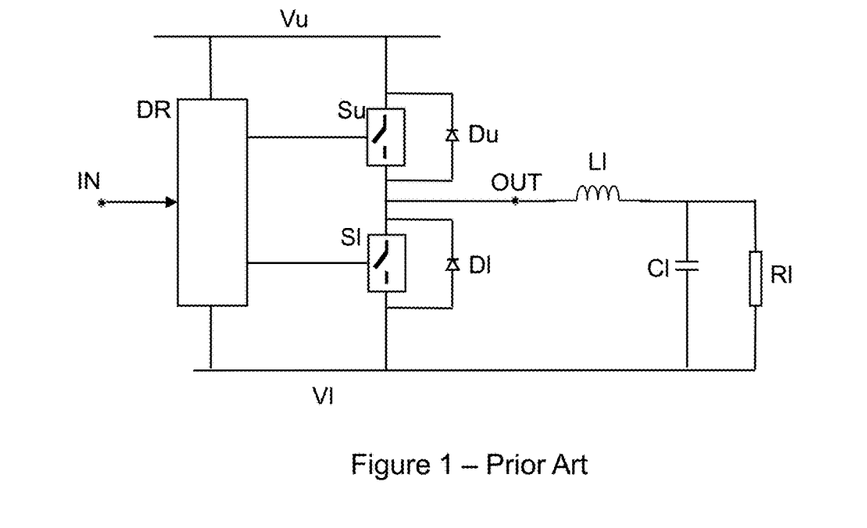
FIG. 1 is an example prior art class D amplifier output stage.

A simplified schematic diagram of a typical prior art class D amplifier output stage is shown in FIG. 1 and includes an input IN for receiving an input signal Vin, an output OUT for providing an output signal Vout to a load. Serially coupled upper and lower switching devices, Su and Sl respectively, coupled between upper and lower power supply voltages Vu and Vl, are configured to provide an output signal Vout to the output OUT. Vu and Vl can be a bipolar power supply providing voltages Vu and Vl, in which for example Vl=−Vu, or a DC power supply with the upper supply voltage Vu=Vs and the lower supply voltage being defined as ground. The switching devices Su and Sl can be implemented with MOSFET transistors.

A driver circuit DR is configured to receive the input signal Vin, and to derive therefrom first and second drive signals for driving the upper and lower switching devices, Su and Sl, alternately from a conducting state into a non-conducting state and vice versa, such that the conducting state periods of the upper switching device Su with respect to those of the lower switching device Sl are mutually exclusive and separated by dead times during which both upper and lower switching devices, Su and Sl, are non-conducting. Diodes Du and Dl are coupled in parallel with the upper and lower switching devices, Su and Sl, and provide a bidirectional current sink for residual load currents during dead times.

In an illustrative mode of operation, the output OUT of the amplifier output stage is connected to a first terminal of a load inductor Ll, which is part of the load. The load also includes a load capacitor Cl and a load resistor Rl coupled in parallel between a second terminal of the load inductor Ll and the lower power supply voltage Vl. The output signal of this prior art output stage varies between Vu and Vl around a reference voltage Vref at (Vu+Vl)/2.

For further details of this prior art amplifier output stage, reference is made to the abovementioned U.S. Pat. No.

7,151,406, which is included by reference herein. These details have been omitted inasmuch as such details are not necessary to obtain a complete understanding of the present invention and are within the skill of persons of ordinary skill in the relevant art.

Figure 1A:
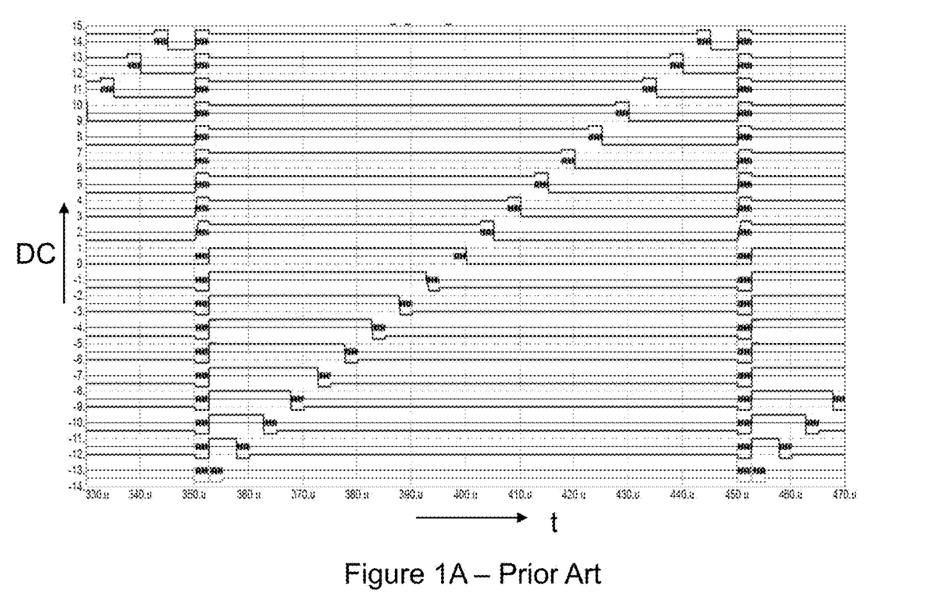
FIGS. 1A, 2A, 2C, 3A and 4A are timing diagrams depicting for the respective class D amplifier output stages shown in FIGS. 1-4, the time dependent variations of the output signal Vout at various amplitude levels expressed in values of the duty cycle of the output signal.

FIG. 1A is a timing diagram depicting for the prior art class D amplifier output stage of FIG. 1, the variations of the output signal Vout in time, for duty cycles of Vout increasing from 0 to 1, corresponding in the diagram with DC=−14 to DC=14, within 1 period of the carrier frequency. A duty cycle (dc) of 0.5 referring to zero signal amplitude corresponds in the diagram with DC=0. Dead times are marked with black bars.

Figure 1B:
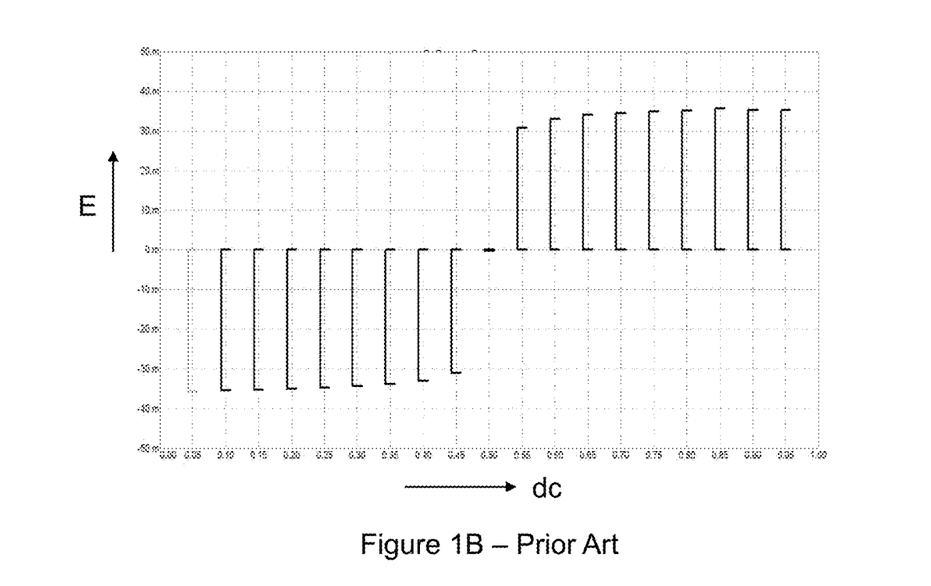
FIGS. 1B, 2B, 2D, 3B, and 4B graphically depict for the class D amplifier output stages shown in FIGS. 1-4, the average error between the input signal Vin and the output signal Vout at various values of the duty cycle of the input signal.

FIG. 1B is a diagram illustrating for the prior art class D amplifier output stage of FIG. 1, the average difference over one period of the carrier frequency of the output signal Vout between the actual output signal Vout including all dead time related errors, such as THD on the one hand and an ideal output signal Vout, which would be obtained with a perfectly linear amplification of the input signal Vin, i.e. without any errors and distortions, at various values of the duty cycle (dc) of Vin. This diagram illustrates the duty cycle (dc) dependent cumulative dead time related error E produced by the amplifier output stage of FIG. 1 and shows that on either side of dc=0.5, E is large over the whole input range.

Figure 2:
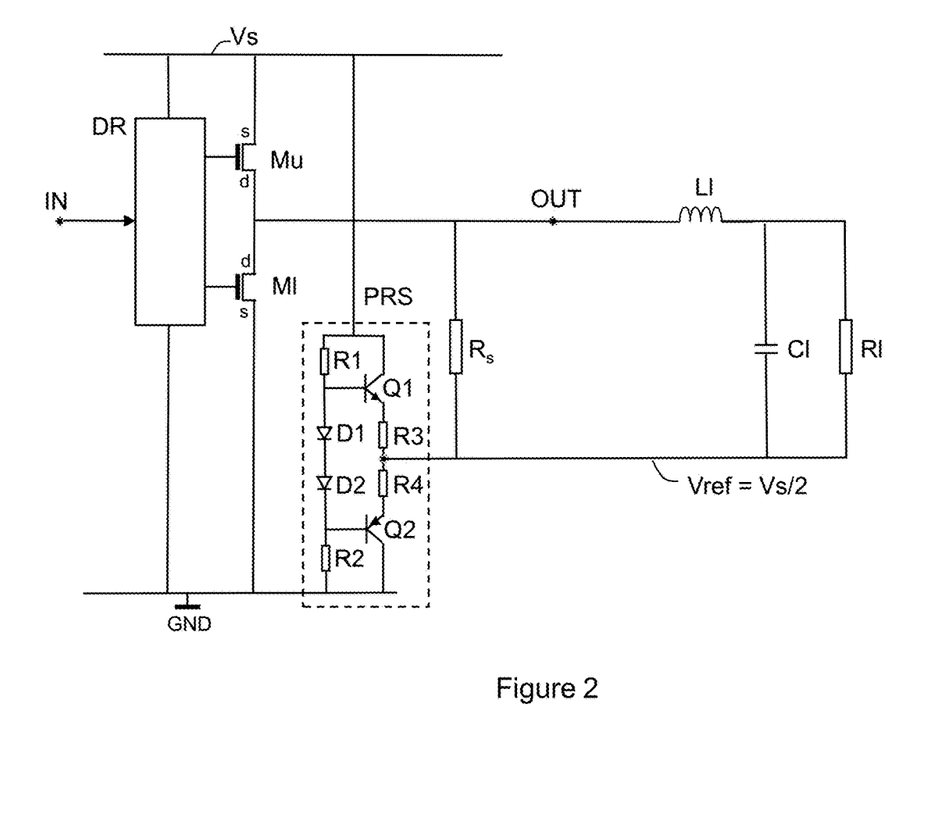
FIG. 2 is an example embodiment of a class D amplifier output stage according to the invention, including a pair of serially coupled common drains CMOS transistors functioning as serially coupled upper and lower switching devices and a sink resistor constituting a linear bidirectional current sink for residual load currents.

FIG. 2 is an example embodiment of a class D amplifier output stage according to the invention, including a pair of serially coupled common drain CMOS transistors Mu and Ml, coupled between a supply voltage Vs and ground GND and functioning as upper and lower switching devices Su and Sl, respectively. Load capacitor Cl and load resistor Rl of the load are coupled in parallel between the second terminal of the load inductor Ll and a virtual ground reference voltage Vref=Vs/2. This virtual ground reference voltage Vref is derived from the supply voltage Vs and ground GND by the use of a power rail splitter PRS. Such power rail splitters are well known in the art, e.g. from Sijosae rail splitter as shown and described in tangentsoft.net/elec/vgrounds.html or Texas Instruments TLE2426Q1 as published at www.ti.com/lit/ds/symlink/tle2426-q1.pdf.

Figure 8:
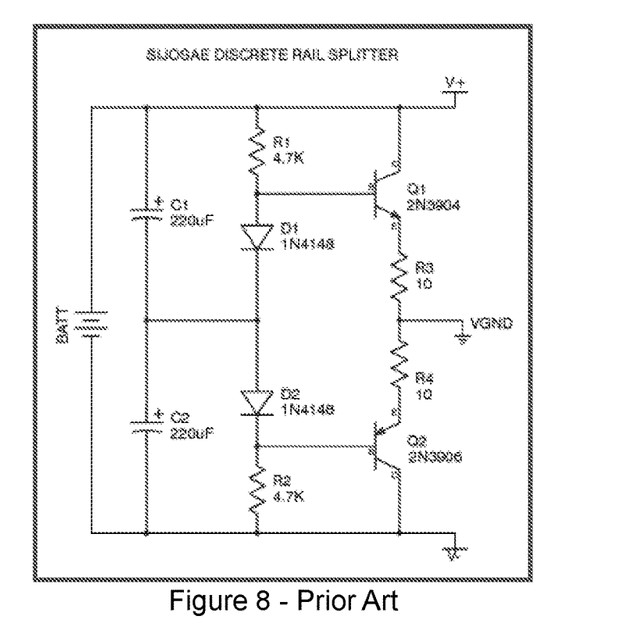
FIG. 8 is an example embodiment of a conventional power-rail splitter.

As illustrated in FIG. 8, the Sijosae rail splitter basically includes, coupled between a supply voltage V+ and ground, a parallel connection of first and second serial arrangements. The first serial arrangement functions as a voltage divider and comprises a resistor R1, coupled to the supply voltage V+ and serially coupled to subsequently first and second diodes D1 and D2 and a second resistor R2, which is coupled to ground. The first and second resistors R1 and R2 are mutually identical, and so are first and second diodes D1 and D2. The second serial arrangement functions as output stage and comprises an NPN transistor Q1 having its collector emitter path serially coupled to subsequently third and fourth resistors R3 and R4 and the emitter collector path of an PNP transistor Q2. The collector of PNP transistor Q2 is coupled to ground. The base electrodes of Q1, respectively t2 are coupled to the common node between R1 and D1, respectively D2 and R2. At the common node of R3 and R4 an output voltage VGND of the power rail splitter PRS is obtained of V+/2, which provides the abovementioned virtual ground reference voltage Vref of FIG. 2. In FIG. 2, sink resistor Rs coupled between the output OUT and the DC reference voltage Vs/2 is used in accordance with the invention to implement a linear bidirectional current sink for residual load currents through the power rail splitter PRS dependent on the polarity of the residual currents to ground GND or to the supply voltage Vs.

Figure 2A:
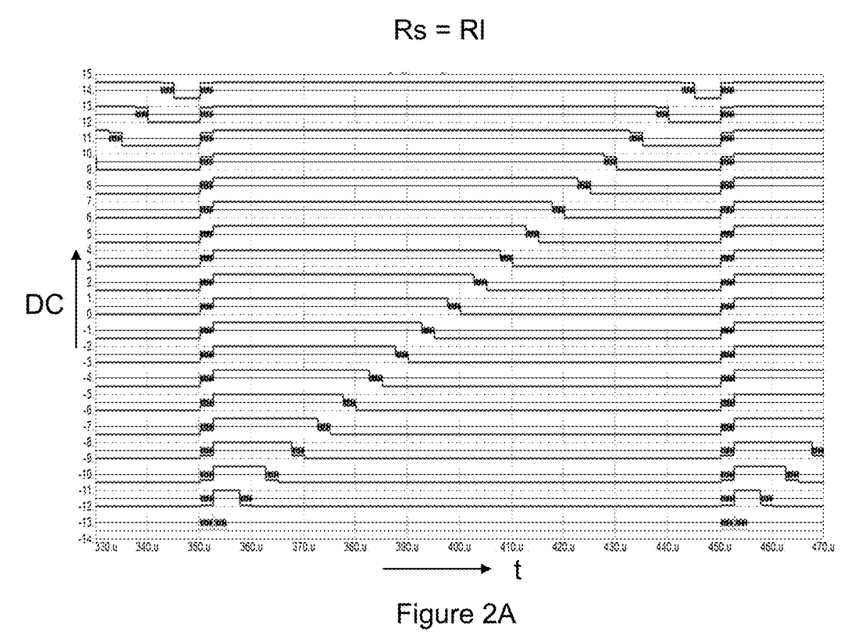

FIG. 2A is a timing diagram depicting for the class D amplifier output stage of FIG. 2, in analogy with FIG. 1A, the variations of the output signal Vout in time, for duty cycles of Vout varying from DC=−14 to DC=14, within 1 period of the carrier frequency with the resistance value of sink resistor Rs being equal to that of load resistor Rl, hereafter in short note Rs=Rl. At this resistance value for sink resistor Rs, the serially coupled common drain CMOS transistors Mu and Ml are operated in linear mode with Vout varying between Vu=+Vs/2 and Vl=−Vs/2 around a reference voltage Vref at Vs/2.

FIG. 2A clearly shows that compared to FIG. 1A, the use of sink resistor Rs with Rs=Rl, significantly reduces the stepwise varying non-linear transients of the output signal Vout during dead times.

Figure 2B:
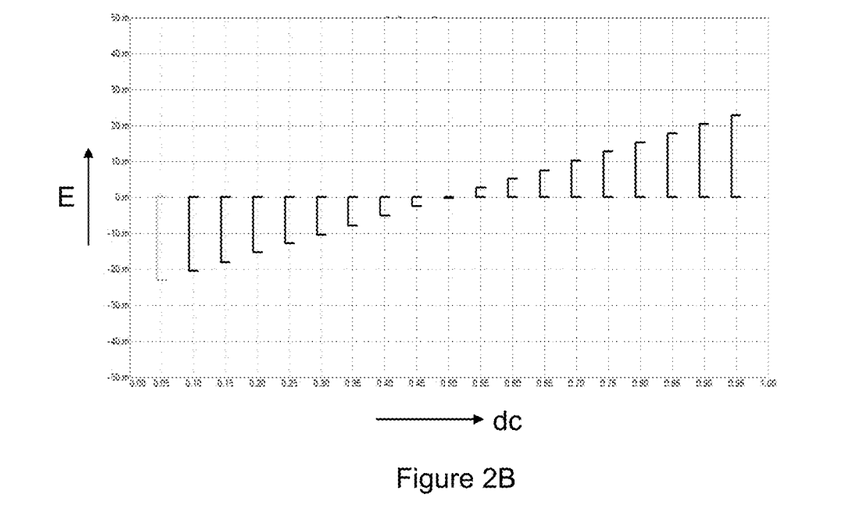

FIG. 2B is a diagram illustrating for the class D amplifier output stage of FIG. 2 with Rs=Rl, in analogy with FIG. 1B, the average difference over one period of the carrier frequency of the output signal Vout between the actual output signal Vout including all dead time related errors, such as THD on the one hand and an ideal output signal Vout, which would be obtained with a perfectly linear amplification of the input signal Vin, i.e. without any errors and distortions, at various values of the duty cycle (dc) of Vin. This diagram illustrates not only that the duty cycle (dc) dependent cumulative dead time related error E produced by the amplifier output stage of FIG. 2 lies as a whole below that of FIG. 1, but also that within the full dc range, E varies with dc along a straight line, i.e. mostly linearly. This means that THD is kept to a minimum.

Figure 2C:
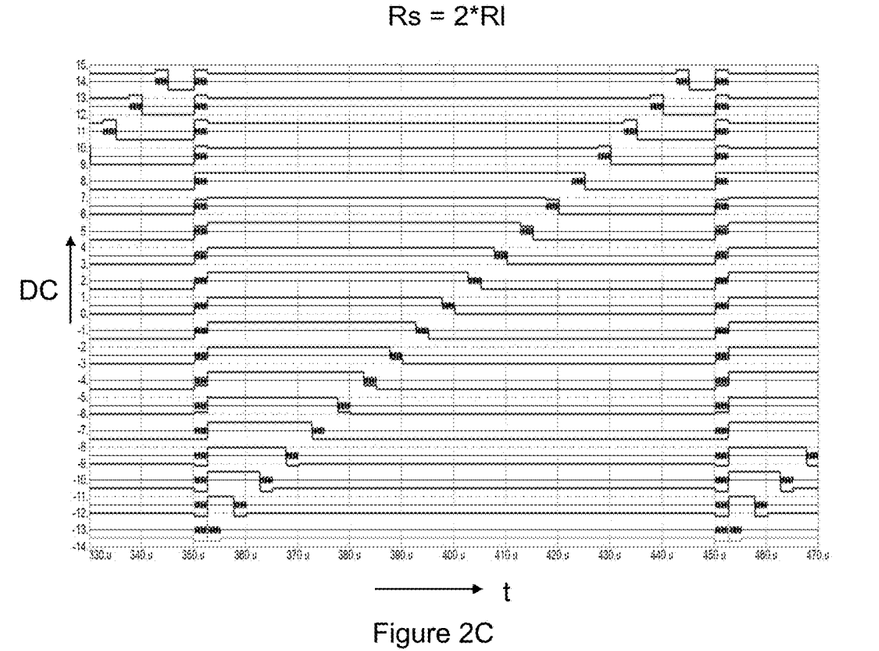

FIG. 2C is a timing diagram, which analogous to FIG. 2A, depicts for the class D amplifier output stage of FIG. 2 with Rs=2*Rl, the variations of the output signal Vout in time. At this resistance value for sink resistor Rs, Mu and Ml are operated in extended linear mode, which means that during dead times Vout at the common drain of Mu and Ml is not limited to the voltage range between Vs and GROUND. The increase of Rs from Rs=Rl to Rs=2*Rl improves the performance of the amplifier output stage on power saving, however at the cost of acceptable THD contributions occurring at large input or output signal amplitudes. Seen within the whole audio amplitude range, these THD contributions therefore hardly affect the overall THD performance.

Figure 2D:
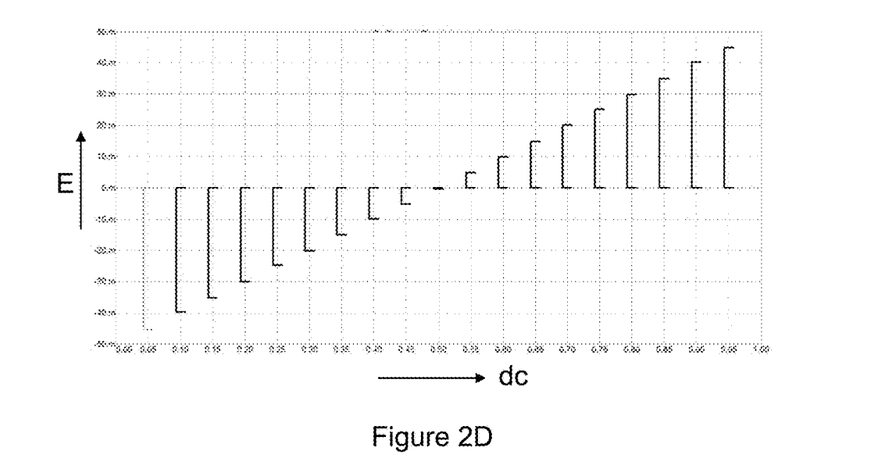

FIG. 2D shows that compared to FIG. 2B, the increase of Rs from Rs=Rl to Rs=2*Rl does not significantly affect the linearity in the dc dependent variation of E. This means that also here, THD due to residual load currents during dead times is kept to a minimum.

Figure 3:
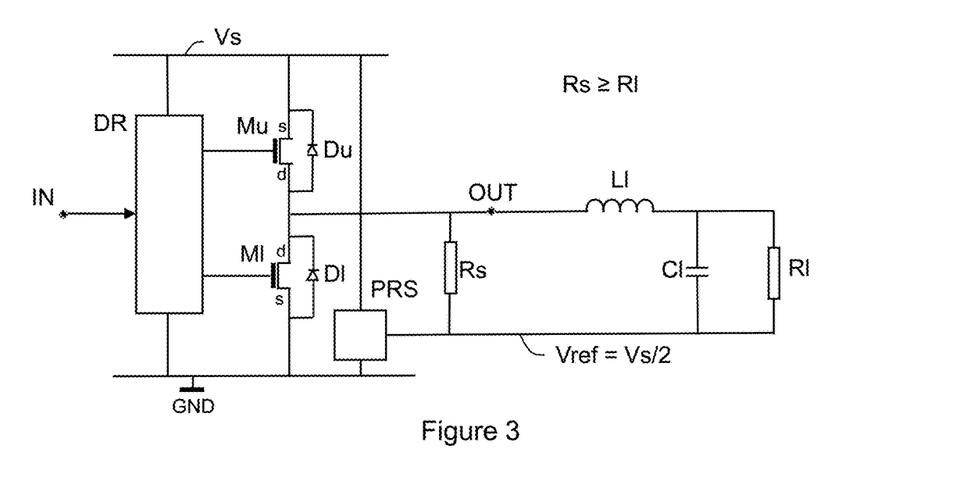
FIG. 3 is an example embodiment of a class D amplifier output stage according to the invention, which differs from FIG. 2 by the use of diodes shunting the CMOS transistors.

FIG. 3 is an embodiment of a class D amplifier output stage according to the invention which differs from FIG. 2 in the use of diodes Du and Dl coupled in parallel to Mu and Ml with Rs=2*Rl. Due to the relatively large sink resistor Rs, non-linearities in the signal transients in the output signal Vout during dead times are significantly reduced for almost all signal amplitudes except for rarely occurring signal amplitudes at or just below maximum. Only at these rarely occurring high amplitude levels the diodes Du and Dl reach the conducting state and may for these very rare and short moments contribute to non-linear transients in the output signal Vout. The non-linearities caused by residual load currents passing through these diodes Du and Dl are therewith kept to a minimum.

Figure 3A:
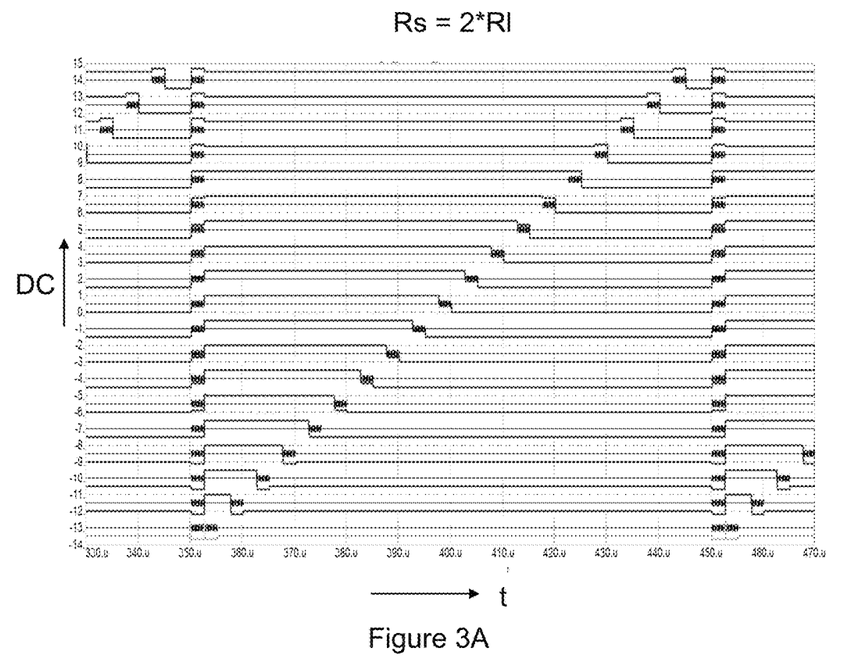

FIG. 3A is a timing diagram, which analogous to FIG. 2C, depicts for the class D amplifier output stage of FIG. 3 with Rs=2*Rl, the variations of the output signal Vout in time. At this value for Rs, it is shown therein that the linearizing effect of sink resistor Rs on the output signal transients during dead times is predominant, whereas the non-linear effects caused by the use of diodes are only marginally. The amplitude of the output signal Vout is limited by the diodes Du and Dl only.

Figure 3B:
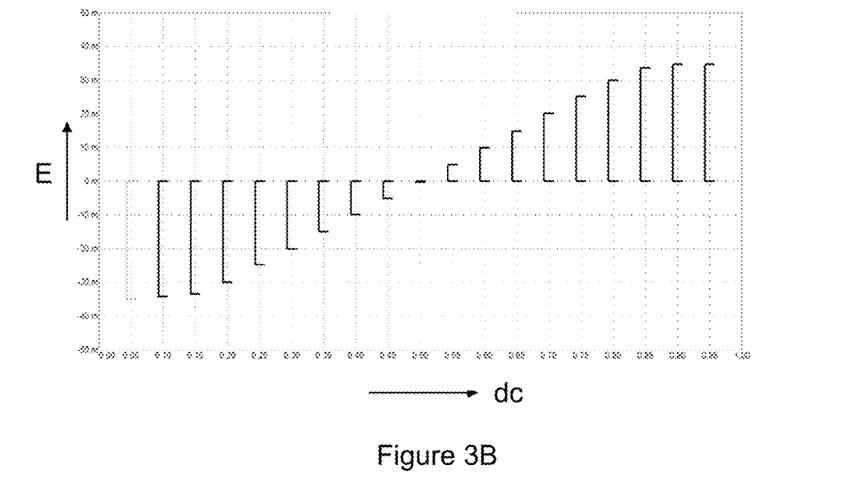

FIG. 3B shows that compared to FIG. 2D, the use of diodes Du and Dl does not significantly affect the linearity in the dc dependent variation of E.

Figure 4:
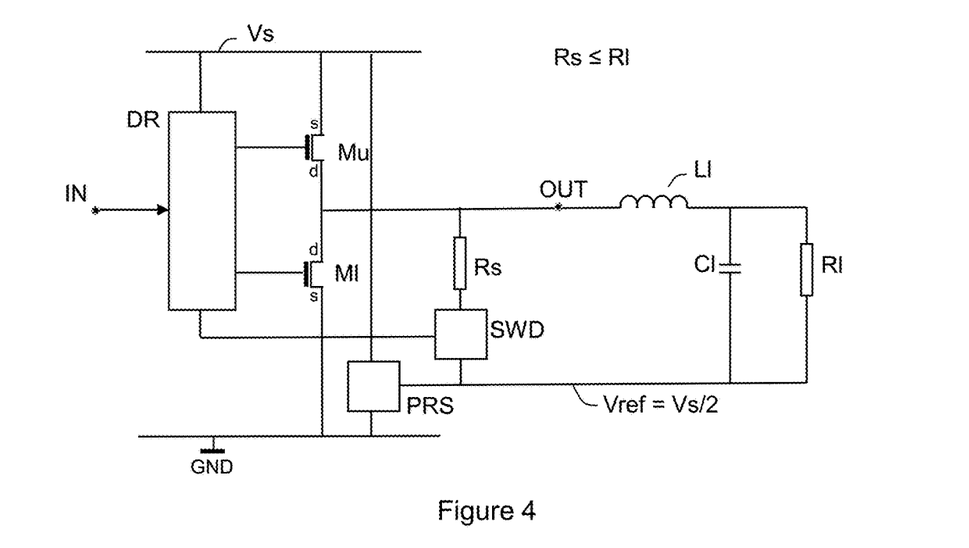
FIG. 4 is an example embodiment of a class D amplifier output stage according to the invention, which differs from FIG. 3 by the use of a switching device activating the current sink during dead times only.

FIG. 4 is an embodiment of a class D amplifier output stage according to the invention which differs from FIG. 3 in the omission of diodes Du and Dl and the use of a switching device SWD between the sink resistor Rs and the reference supply voltage Vref=Vs/2. This embodiment is operated in switched linear mode, in which the switching device SWD is controlled by the driver circuit DR, configured to connect sink resistor Rs to the reference supply voltage Vref=Vs/2 during dead times and disconnect the same for the period beyond dead times. As sink resistor Rs is not effective beyond the dead times, Rs can be chosen at Rs≤Rl and be optimized for minimum THD, without increasing power consumption. With such small resistance values for sink resistor Rs, there is no need for diodes parallel to the switching devices as these diodes will never reach their conducting state.

Figure 4A:
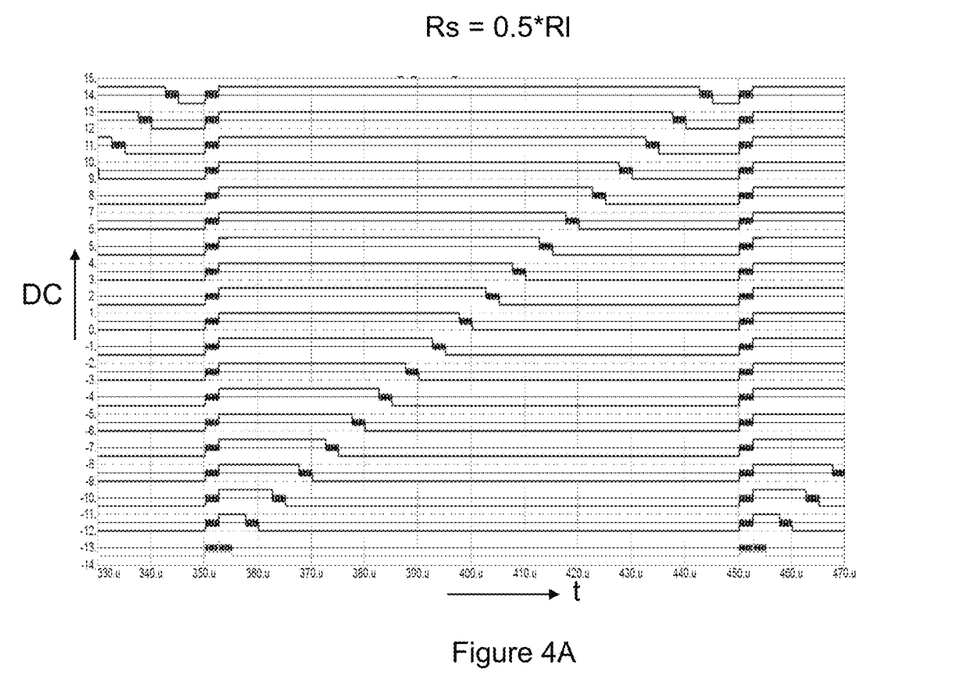

FIG. 4A is a timing diagram, which analogous to FIG. 3A, depicts for the class D amplifier output stage of FIG. 4, the variations of the output signal Vout in time, with Rs=0.5 Rl. It is shown therein, that the linearizing effect of sink resistor Rs on the output signal transients during dead times is strongly predominant.

Figure 4B:
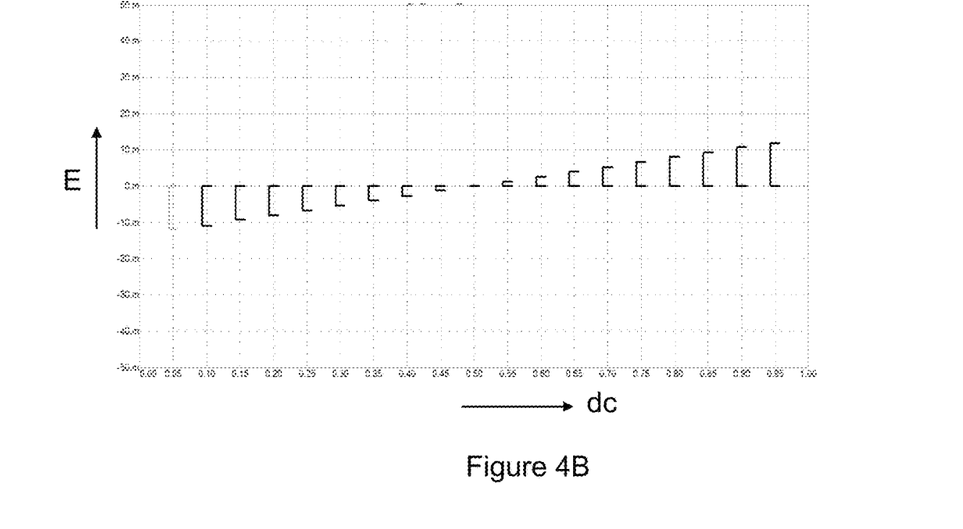

FIG. 4B shows that the improvement on THD which can be obtained with the embodiment of FIG. 4 exceeds that of the preceding FIGS. 2 and 3.

Figure 5:
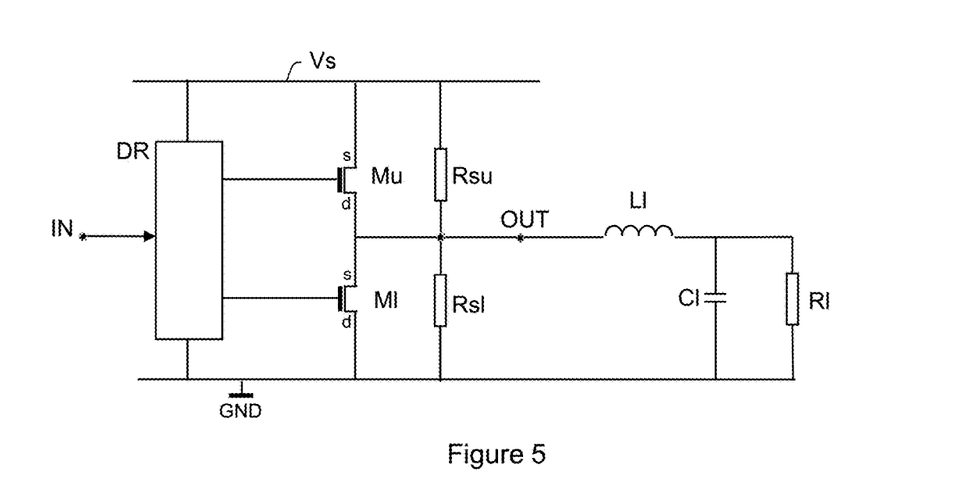
FIG. 5 is an example embodiment of a class D amplifier output stage according to the invention, with corresponding functionality as the embodiment of FIG. 2, however using a pair of serially coupled resistors to provide a linear bidirectional current sink for residual load currents.

FIG. 5 is an embodiment of a class D amplifier output stage according to the invention with corresponding functionality as the embodiment of FIG. 2, in which Vu=Vs and Vl is coupled to ground (GND). It uses a pair of mutually equal upper and lower sink resistors Rsu and Rsl serially coupled between a supply voltage Vs and ground. Ru and Rl are configured to provide a linear bidirectional current sink for residual load currents in that the common connection of Ru and Rl is connected with the common connection of the CMOS transistors Mu and Ml and the output OUT. The output OUT provides an output signal Vout varying between Vs and ground.

Figure 6:
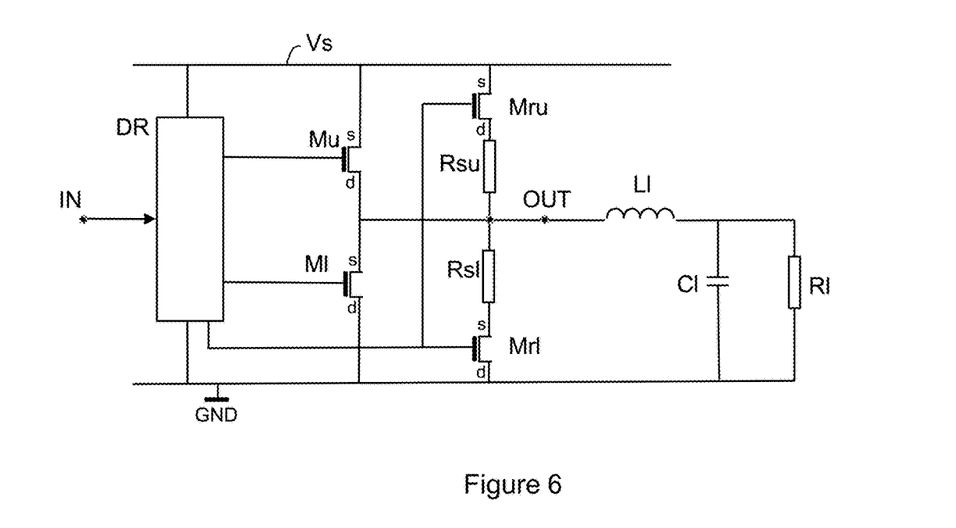
FIG. 6 is an example embodiment of a class D amplifier output stage according to the invention, which differs from the embodiment of FIG. 5 in the use of switching devices activating the current sink during dead times only.

FIG. 6 is an embodiment of a class D amplifier output stage according to the invention, which is operable in switched mode. It differs from the embodiment of FIG. 5 in the use of upper and lower switching devices, which are implemented with CMOS transistors Mru and Mrl and respectively serially connected between Rsu and supply voltage Vs and Rsl and ground. Mm and Mrl are simultaneously operated and controlled by the driver circuit DR, which is configured to connect sink resistor Rsu and Rsl respectively to the supply voltage Vs and ground during dead times and disconnect the same for the periods beyond dead times. As a result, the linear bidirectional current sink provided by Rsu and Rsl is active during dead times only.

Rsu and Rsl can therefore be chosen at Rs≤Rl and be optimized for minimum THD, without increasing power consumption.

Figure 7:
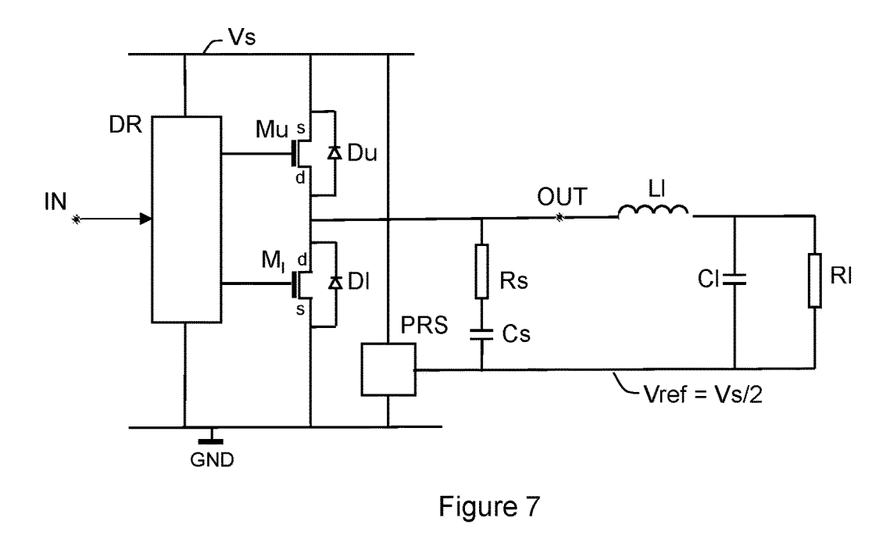
FIG. 7 is an example embodiment of a class D amplifier output stage according to the invention, which is optimized in its performance on power saving and simplicity of circuit implementation.

FIG. 7 is an embodiment of a class D amplifier output stage according to the invention with functionality corresponding to FIG. 3. Unlike FIG. 3, in which sink resistor Rs is coupled between the output OUT and reference voltage Vref=Vs/2, sink resistor Rs in FIG. 5 is coupled to the reference voltage Vref via a sink capacitor Cs. The use of the sink capacitor Cs increases the power efficiency of the output stage.

Now, the present invention has here above been disclosed with reference to preferred embodiments thereof. Persons skilled in the art will recognize that numerous modifications and changes may be made thereto without exceeding the scope of the appended Claims. In consequence, the embodiments should be considered as being illustrative, and are not meant to exclude alternative embodiments from the invention. Specific structural and functional details disclosed herein are not to be interpreted as limiting but merely as a basis for the claims and as a representative basis for enabling someone skilled in the art to employ the present invention in a variety of manners. No restriction should be construed from those embodiments, other than as have been recited in the Claims.

Throughout the specification, and in the claims, the term "coupled" means either a direct electrical connection between the things that are connected, or an indirect connection through one or more passive or active intermediary devices. The term "circuit" means one or more passive and/or active components that are arranged to cooperate through digital or analogue signals with one another to provide a desired function. The term "signal" means at least one current signal, voltage signal, electromagnetic wave signal, or data signal. The meaning of "a", "an", and "the" include plural references. The meaning of "in" includes "in" and "on".

The terms "comprises", "comprising", "includes", "including" and "having" as used herein, are to be construed as being inclusive and open ended, and not exclusive. Specifically, when used in this specification including claims, the terms "comprises", "comprising", "includes", "including" and "having" and variations thereof mean that specified features, steps or components are included. These terms are not to be interpreted to exclude the use of other features, steps or components.

The terms "substantially", "about" and "approximately", when used in conjunction with ranges of dimensions, compositions of mixtures or other physical properties or characteristics, are meant to cover slight variations that may exist in the upper and lower limits of the ranges of dimensions so as to not exclude embodiments where on average most of the dimensions are satisfied but where statistically dimensions may exist outside this region. It is not the intention to exclude such embodiments from the present invention.

The phrase "X and/or Y" as used herein, is meant to be interpreted as "one or both of X and Y" wherein X and Y are any word, phrase, or clause.

The term "configured to" shall be construed as non-limiting, i.e. it does not preclude the item it refers to from having other features or functions.

The invention claimed is:
1. A class D amplifier comprising:
an input for receiving an input signal,
an output for providing an output signal to a load,
serially coupled upper and lower switching devices configured to provide an output signal to the output,
a driver circuit configured to receive the input signal, and to derive therefrom first and second drive signals for driving the upper and lower switching devices alternately from a conducting state into a non-conducting state and vice versa, such that the conducting state periods of the upper switching device with respect to those of the lower switching device are mutually exclu- sive and separated by dead time intervals during which both upper and lower output transistors are non-conducting, a substantially linear circuit configured to provide a bidirectional current sink for residual currents from the load occurring during at least part of each dead time interval, and a dead time controlled switching device that is configured to activate the substantially linear circuit during the dead time intervals only.

2. The class D amplifier of claim 1, wherein the substantially linear circuit includes a resistor configured to provide the bidirectional current sink.

3. The class D amplifier of claim 2, comprising a pair of serially coupled upper and lower common drain CMOS switching transistors implementing the upper and lower switching devices, respectively.

4. The class D amplifier of claim 3, wherein a resistance value of the resistor exceeds that of the load and upper and lower diodes that are coupled in parallel to the serially coupled common drain CMOS switching transistors.

5. The class D amplifier of claim 2, wherein the resistance value of the resistor is at most equal to that of the load.

6. The class D amplifier of claim 5, wherein the dead time controlled switching device is configured to limit operation of the resistor as linear bidirectional current sink to the dead time intervals only.

7. The class D amplifier of claim 3, wherein the resistor is serially coupled to a buffer capacitor between the output of the amplifier and ground, and is configured to supply power to the buffer capacitor during the dead time intervals, and to buffer power beyond the dead time intervals.

8. The class D amplifier of claim 1, comprising a pair of serially coupled upper and lower common drain CMOS switching transistors implementing the upper and lower switching devices, respectively.

9. The class D amplifier of claim 1, wherein the output signal is sufficient to produce an audio signal corresponding to the input signal via a speaker.

10. The class D amplifier of claim 9, including the speaker.

11. A method of operating a class D amplifier, comprising:
converting an input signal to first and second drive signals for driving upper and lower switching devices of the class D amplifier alternately from a conducting state into a non-conducting state and vice versa, such that the conducting state periods of the upper switching device with respect to those of the lower switching device are mutually exclusive and separated by dead times during which both upper and lower output transistors are non-conducting, and substantially linearizing signal transients caused by residual load currents from the load occurring during at least part of each dead time by controlling a dead time switching device that, during each dead time, activates a substantially linear circuit that provides a bidirectional current sink for the residual currents from the load.

12. A class D amplifier comprising:
a pair of switching devices that are connected in series between an upper voltage and a lower voltage and are alternately switched between a conducting state and a nonconducting state such that both switching devices are not concurrently in the conducting state;

a splitter that creates a virtual voltage reference at a level substantially half way between the upper and lower voltage;

an output load that is coupled between a juncture between the pair of switching devices and the virtual voltage reference; and a substantially linear bidirectional current sink coupled between the juncture and the virtual voltage reference, parallel to the output load, and a dead time controlled switching device that is configured to activate the substantially linear bidirectional current sink only during dead times when both switching devices are not in the conducting state.

13. The class D amplifier of claim 12, wherein the bidirectional current sink comprises a resistor coupled between the juncture and the virtual voltage reference.

14. The class D amplifier of claim 13, wherein a resistance of the resistor is at most equal to a resistance of the output load.

15. The class D amplifier of claim 13, including a pair of diodes, each diode coupled in parallel to each of the pair of switching devices.

16. The class D amplifier of claim 12, wherein the bidirectional current sink comprises a resistor in series with a buffer capacitor coupled between the juncture and the virtual voltage reference, and configured to supply power during the dead times, and to buffer power at other times.

17. A class D amplifier comprising:
a pair of switching devices that are connected in series between an upper voltage and a lower voltage and, based on an input signal, are alternately switched between a conducting state and a nonconducting state such that, during dead times, both switching devices are not concurrently in the conducting state;

an output load that is coupled between a juncture between the pair of switching devices and one of the upper or lower voltages; and a voltage splitter coupled between the upper and lower voltage and providing a voltage between the upper and lower voltage to the juncture between the pair of switching devices and one of the upper or lower voltages, thereby providing a substantially linear bidirectional current sink across the pair of switching devices, and a dead time controlled switching device that is configured to activate the substantially linear bidirectional current sink during the dead times only.

18. The class D amplifier of claim 17, wherein the voltage splitter includes a first and second resistor, each coupled in series with a first and second dead time controlled switching device, wherein the first and second dead time controlled switching devices are in a conductive state only during the dead times.

19. The class D amplifier of claim 18, wherein resistances of the first and second resistors are at most equal to a resistance of the output load.

20. The class D amplifier of claim 18, including a speaker in the output load that produces an audio signal corresponding to the input signal.

* * * * *